(12) United States Patent
Usami et al.

(10) Patent No.: US 6,225,217 B1
(45) Date of Patent: May 1, 2001

(54) METHOD OF MANUFACTURING SEMICONDUCTOR DEVICE HAVING MULTILAYER WIRING

(75) Inventors: Tatsuya Usami; Hidemitsu Aoki; Yasuaki Tsuchiya; Shinya Yamasaki, all of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/439,809

(22) Filed: Nov. 12, 1999

Related U.S. Application Data

(62) Division of application No. 09/104,714, filed on Jun. 25, 1998.

(30) Foreign Application Priority Data

Jun. 27, 1997 (JP) .................................................. 9-172056

(51) Int. Cl.[7] .................... H01L 21/4753; H01L 21/311; H01L 21/302; H01L 21/461
(52) U.S. Cl. ...................... 438/637; 438/622; 438/623; 438/624; 438/634; 438/700; 438/735; 438/736
(58) Field of Search ........................... 438/637, 639, 438/672, 675, 642, 643, 645, 623, 624, 622, 735, 736, 737, 738, 740, 700, 625, 626, 631, 633, 636

(56) References Cited

U.S. PATENT DOCUMENTS

| | | | |
|---|---|---|---|
| 3,846,166 | 11/1974 | Saiki et al. | 117/212 |
| 4,357,203 | 11/1982 | Zelez | 156/643 |
| 5,442,237 | 8/1995 | Hughes et al. | 257/759 |
| 5,504,042 | * 4/1996 | Cho et al. | 437/247 |
| 5,573,633 | * 11/1996 | Gambino et al. | 156/636.1 |

FOREIGN PATENT DOCUMENTS

| | | | |
|---|---|---|---|
| 0 680 084 A1 | 4/1995 | (EP) | H01L/21/768 |
| 0680084 | * 11/1995 | (EP) . | |
| 0 822 586 A2 | 2/1998 | (EP) | H01L/21/316 |
| 0 834 916 A2 | 4/1998 | (EP) | H01L/21/768 |
| 2137808 | * 10/1984 | (GB) . | |
| 3203240 | * 9/1991 | (JP) . | |
| H8-64679 | 3/1996 | (JP) | H01L/21/768 |
| H9-50993 | 2/1997 | (JP) | H01L/21/312 |

\* cited by examiner

*Primary Examiner*—Charles Bowers
*Assistant Examiner*—Thanhha Pham
(74) *Attorney, Agent, or Firm*—Hayes, Soloway, Hennessey, Grossman & Hage

(57) ABSTRACT

A first insulating film with a dielectric constant lower than that of a silicon oxide film is formed on a semiconductor substrate. Next, a metal film or a second insulating film, which has degrees of moisture absorption and deformation in an oxygen plasma process and exposure to a resist releasing solution equal to or less than those of a silicon oxide film, is formed on the first insulating film. Then, the metal film or the second insulating film is patterned to a prescribed pattern. An opening is formed in the first insulating film using the metal film or the second insulating film as a mask.

10 Claims, 19 Drawing Sheets

METHOD OF MANUFACTURING SEMICONDUCTOR DEVICE HAVING MULTILAYER WIRING

This is a divisional of copending application Ser. No. 09/104,714 filed on Jun. 25, 1998.

BACKGROUND OF THE INVENTION

1. Field of the Invention

This invention relates to a method of manufacturing a semiconductor device having multilayer wiring, and, especially, to a method of manufacturing a semiconductor device in which the dielectric constant of an insulation film formed between wiring layers is reduced.

2. Description of the Related Art

A development of semiconductor integrated circuits with a fine structure has been attained in recent years. Such a development is particularly significant in the fields of semiconductor integrated circuits containing logical circuits with a multilayer wiring structure. As the interval between metal wiring layers is micro-sized, a wiring capacitance increases which causes a reduction in electric signal speed and defects due to crosstalk occurs, that is a phenomenon in which some signals affects other signals in terms of a noise. For this, studies for reducing the dielectric constant of an insulation film formed between wiring layers have been made.

For example, there is a description of an evaluation of the dielectric constant of Hydrogen Silsesquioxane (HSQ) in 43rd Apply. Phys. Lett., Related Society Lecture Preprints, No. 2 issue, p654, (26a-N-6 "Evaluation of Dielectric Constant of Hydrogen Silsesquioxane (ESQ)"). In this description of the Preprints, the specific dielectric constant of an inorganic SOG (Spin On Glass) film formed by curing in a condition of reduced pressure is 2.7. However, when an $O_2$ plasma process is performed, the specific dielectric constant increases up to 3.9. This is, as described in the description of the Preprints, because an Si—OH bond is produced in the film in the $O_2$ plasma process whereby a water content in the HSQ film is increased.

It is considered that the above semiconductor is manufactured according to a general process though a production process for the semiconductor device is not described in the above Preprints. Here, a conventional process for manufacturing a semiconductor device with multilayer wiring will be explained. FIGS. 1A to 1F are sectional views showing a customary method of manufacturing a semiconductor device in sequential order.

In a conventional method of producing a semiconductor device, as shown in FIG. 1A, a first silicon oxide film 101 with a thickness of about 500 nm is first formed on a silicon substrate (not shown). Next, a first aluminum-based metal wiring layer 102 is selectively formed on the first silicon oxide film 101. An HSQ film 103 with a thickness of about 400 nm is then formed on the first silicon oxide film 101 as a low dielectric constant film by application and annealing. At this time, the upper surface of the first aluminum-based metal wiring layer 102 is coated with the HSQ film 103. A second silicon oxide film 104 with a thickness of about 1400 nm is successively formed on the HSQ film 103. Then, for formation of a flat surface, the thickness of the second silicon oxide film 104 is reduced to as thin as about 700 nm by chemically mechanical polishing (CMP). After that, a photoresist 105 is applied to the second silicon oxide film 104. The applied photoresist 105 is exposed and developed so that it has a prescribed pattern.

Next, as shown in FIG. 1B, the second silicon oxide film 104 and the HSQ film 103 are etched using a fluorocarbon-containing gas and utilizing the photoresist 105 as a mask. As a consequence, a contact hole 104a extending to the first aluminum-based metal wiring layer 102 is formed under an opening of the photoresist 105.

After that, an $O_2$ plasma process is performed. At this time, the HSQ film 103 open to the contact hole 104a is exposed to the $O_2$ plasma whereby an Si—OH bond is produced on the surface of the ESQ film 103 which is open to the contact hole 104a. Then, as shown FIG. 1C, the photoresist 105 is removed by a resist releasing solution. At this time, since the surface of the HSQ film 103 open to the contact hole 104a is exposed to the resist releasing solution, a moistened portion 106 with a water content higher than that of the remainder portions is formed on the surface.

Then, as shown in FIG. 1D, a titanium nitride film 107 is formed as a barrier metal film on the entire surface. A tungsten film 108 is formed on the titanium nitride film 107 by a blanket CVD method. In this case, a void 109 is sometimes formed within the contact hole 104a.

As shown in FIG. 1E, the tungsten film 108 and the titanium nitride film 107 formed on the second silicon oxide film 104 are removed by a tungsten etch back method whereby the tungsten film 108 and the titanium nitride film 107 only formed within the contact hole 104a are left unremoved.

As shown in FIG. 1F, a second aluminum-based metal wiring layer 110 is then formed on the entire surface.

It was confirmed that the semiconductor device produced in this conventional manner had high junction resistance and a connection failure had been produced in the contact hole 104a.

Next, a conventional method of manufacturing a semiconductor device provided with a channel-wiring layer will be illustrated. FIGS. 2A to 2F are sectional views showing a conventional method of manufacturing a semiconductor device in sequential order. First, a plurality of base layers (not shown) are formed on a silicon substrate (not shown) and a silicon nitride film 111 with a thickness of about 100 nm is formed on the top of the base layers as shown in FIG. 2A. Then, an HSQ film 112 with a thickness of about 500 nm is formed on the silicon nitride film 111 by application and annealing. A silicon oxide film 113 with a thickness of about 100 nm is formed as a cap film on the HSQ film 112.

Next, as shown in FIG. 2B, a photoresist film 114 is applied to the silicon oxide film 113, Then, it is exposed and developed so that it has a prescribed pattern.

After that, as shown in FIG. 2C, the silicon oxide film 113 and the HSQ film 112 are etched using a fluorocarbon-containing gas and utilizing the photoresist 114 as a mask. As a consequence, a channel 112a extending to the silicon nitride film 111 is formed under an opening of the photoresist 114.

Then, an $O_2$ plasma process is performed. At this time, the surface of the HSQ film 112 open to the channel 112a is denatured and tends to be moistened. Then, as shown in FIG. 2D, the photoresist 114 is removed by a resist releasing solution. At this time, since the surface of the HSQ film 112 open to the channel 112a is exposed to the resist releasing solution, a moistened portion 115 with a water content higher than that of the remainder portions is formed on the surface.

Then, as shown in FIG. 2E, a titanium film 116 with a thickness of about 50 nm is formed as a barrier metal film on the entire surface by a MOCVD method followed by a step of forming a copper film 117 with a thickness of about 500 nm on the entire surface by a CVD method.

As shown in FIG. 2F, the copper film 117 and the titanium film 116 formed on the silicon oxide film 113 are removed by CMP treatment whereby the copper film 117 and the titanium film 116 only formed within the channel 112a are left unremoved.

The capacitance between channel-wiring layers of the semiconductor device prepared in this manner was measured. As a result, the measured capacitance was the same as that of a semiconductor device produced utilizing a formation of a general plasma oxide film. It is considered that this is due to the $O_2$ plasma process.

As a film with a low dielectric constant, a film other than the HSQ film is sometimes used. An example of using a fluororesin film as the film of a low dielectric constant is described in Monthly Semiconductor World, February (1997), p82–84, entitled "An improvement in etching characteristics for preparing a low dielectric constant due to a fluororesin film is achieved, but a problem of oxygen plasma resistance remains". In this prior art, a via hole is formed using a fluororesin film with a dielectric constant of 2.5 or less composed of a cyclic fluororesin and a siloxane polymer. FIGS. 3A to 3D are sectional views showing a customary method of manufacturing a semiconductor device in sequential order. First, as shown in FIG. 3A, a first silicon oxide film 121 is formed on a silicon substrate (not shown). Then, a first aluminum-based metal wiring layer 122 is selectively formed on the first silicon oxide film 121. A liner film 123 composed of a silicon oxide film is formed on the entire surface. Next, a fluororesin film 124 is formed on the liner film 123, and a second silicon oxide film 125 is formed on the fluororesin film 124. Then, a photoresist 126 is applied to the surface of the fluororesin film 124, followed by exposure and developing to carry out the patterning of the photoresist 126.

Next, as shown in FIG. 3B, the second silicon oxide film 125, the fluororesin film 124 and the liner firm 123 are etched using the photoresist 126 as a mask. As a consequence, a via hole 124a extending to the first aluminum-based metal wiring layer 122 is formed under an opening of the photoresist 126.

After that, an $O_2$ plasma process is performed. At this time, the surface of the fluororesin film 124 open to the via holes 124a is exposed to the plasma. In addition, as shown in FIG. 3C, the photoresist 126 is also removed by a resist releasing solution. In this case, the side wall of the via hole 124a is shaped into a bow-like form by erosion.

Though no remainder steps following the above step are described, it is assumed that the following steps will be performed. As shown in FIG. 3D, a titanium nitride film 129 as a barrier metal film and a second aluminum-based metal wiring layer 127 as a plug are formed on the entire surface. However, a void 128 is probably formed within the second aluminum-based metal wiring layer 127 because of the erosion of the fluororesin film 124.

The reason why the side wall of the via hole 124a is shaped into a bow-like form by erosion is that the fluororesin film 124 is exposed to $O_2$ plasma and then carbon in the film reacts with oxygen to produce $CO_2$ gas which causes decomposition of the fluororesin film 124.

As the foregoing shows, even if a film with a low dielectric constant is used, an only insufficient reduction in the dielectric constant can be attained. Also, a problem of formation of a void in a metal layer remains unsolved.

SUMMARY OF THE INVENTION

It is an object of the present invention to provide a method of manufacturing a semiconductor device having multilayer wiring which can reduce the capacitance between wiring layers and prevent an increase in the junction resistance in an opening such as a contact hole.

According to an aspect of the present invention, there is provided a method of manufacturing a semiconductor device having multilayer wiring comprising a step of forming a first insulating film having a dielectric constant lower than that of a silicon oxide film on a semiconductor substrate. The method comprises a step of forming a metal film or a second insulating film on the first insulating film, a step of patterning the metal film or the second insulation film to be a prescribed form and a step of forming an opening in the first insulating film using the metal film or the second insulating film as a mask. The second insulating film has degrees of moisture absorption and deformation in an oxygen plasma process and exposure to a resist releasing solution equal to or less than those of a silicon oxide film.

In the present invention, even if a photoresist is used for patterning the metal film or second insulating film, oxygen plasma process is performed and a resist releasing solution is applied to release the photoresist, the first insulating film is not exposed to the oxygen plasma and the resist releasing solution at all. A rise in the dielectric constant caused by moisture absorption of the first insulating film is hence prevented and the capacitance between wiring layers can be efficiently reduced. The deformation of the first insulating film is also prevented. Furthermore, no void is formed within the opening thereby preventing an increase in the junction resistance.

DETAILED DESCRIPTION OF THE PREFERRED EMBODIMENT

A method of manufacturing the semiconductor device corresponding to an embodiment of the present invention is now explained in detail with reference to the drawings. FIGS. 4A to 4F are sectional views showing a method of manufacturing a semiconductor device in sequential order according to a first embodiment of the present invention.

Figure 1A:
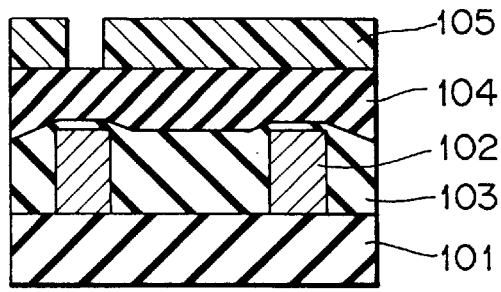
FIGS. 1A to 1F are sectional views showing a conventional method of manufacturing a semiconductor device in sequential order.
Figure 1B:
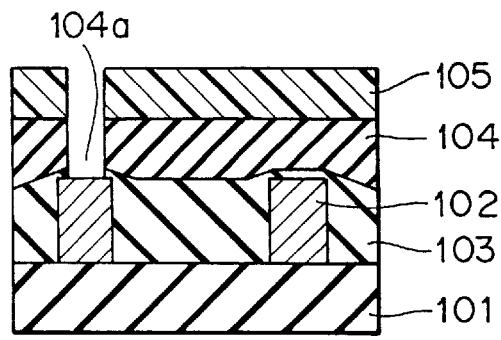
Figure 1C:
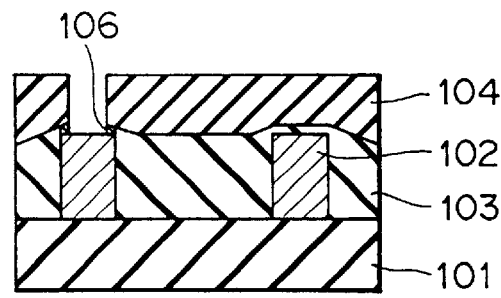
Figure 1D:
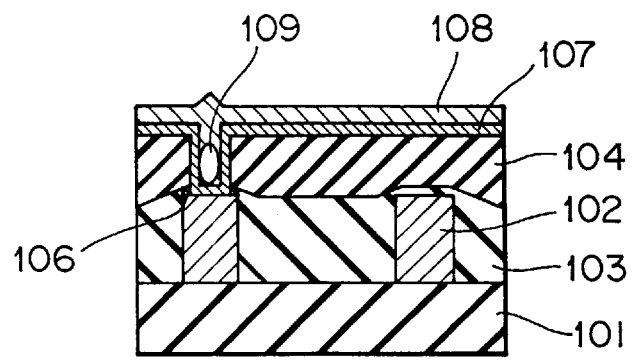
Figure 1E:
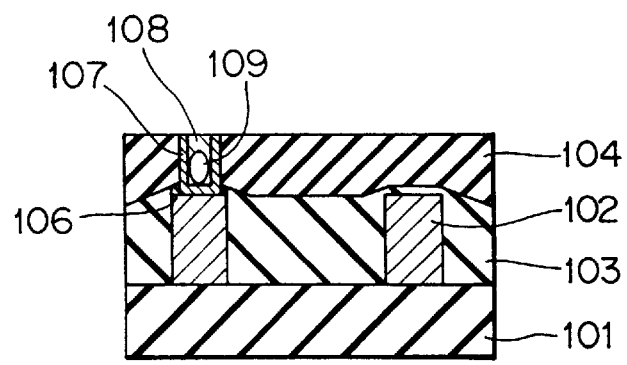
Figure 1F:
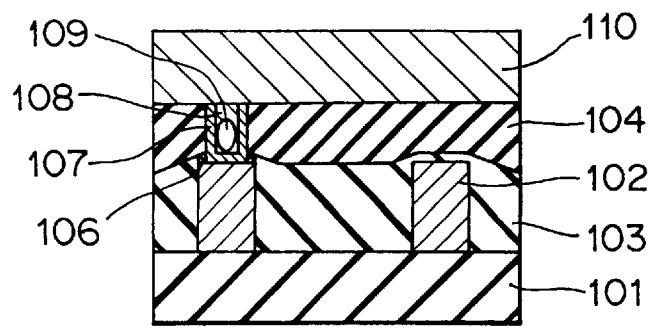
Figure 2A:
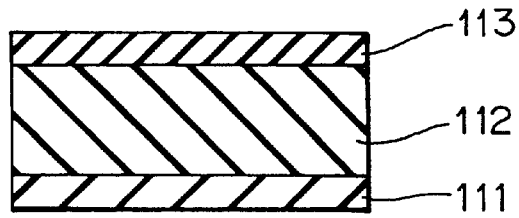
FIGS. 2A to 2F are sectional views showing another conventional method of manufacturing a semiconductor device in sequential order.
Figure 2B:
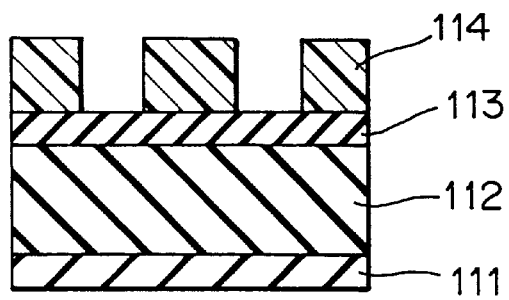
Figure 2C:
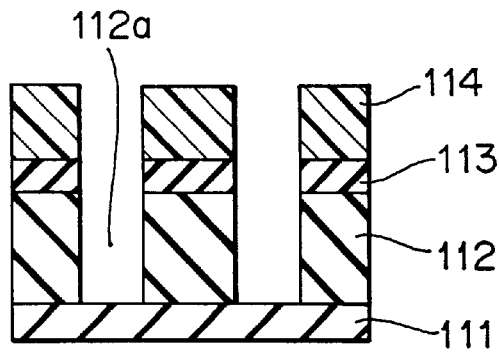
Figure 2D:
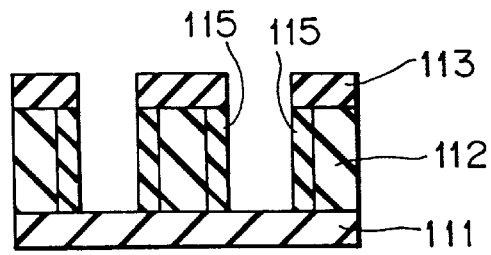
Figure 2E:
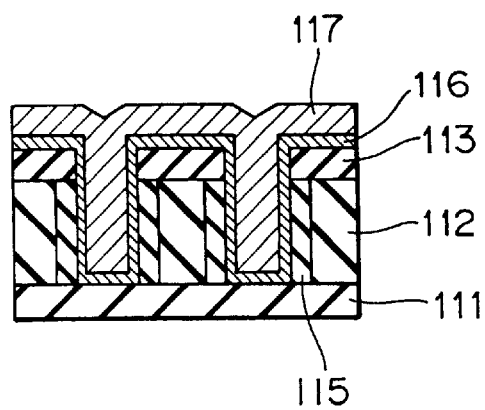
Figure 2F:
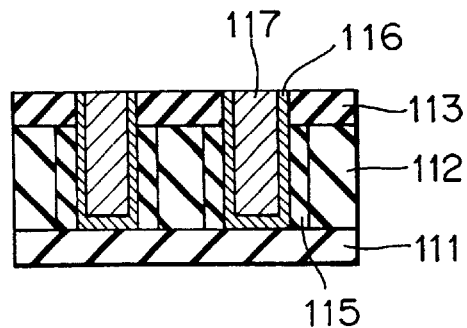
Figure 3A:
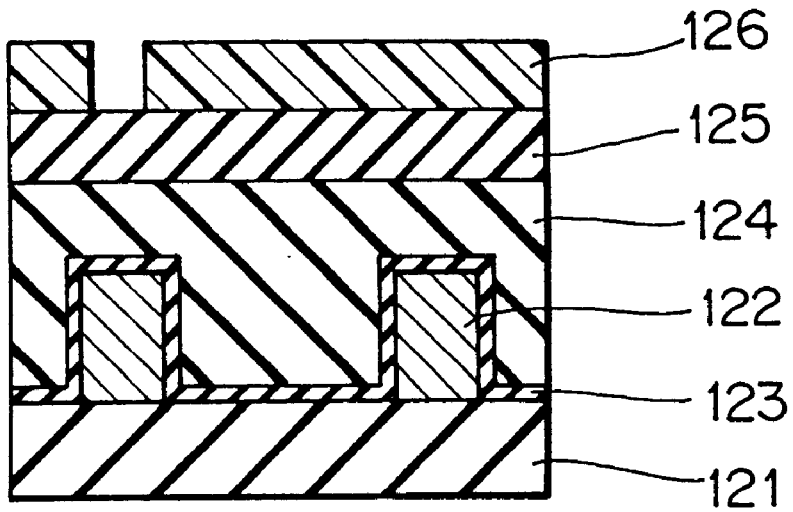
FIGS. 3A to 3D are sectional views showing another conventional method of manufacturing a semiconductor device in sequential order.
Figure 3B:
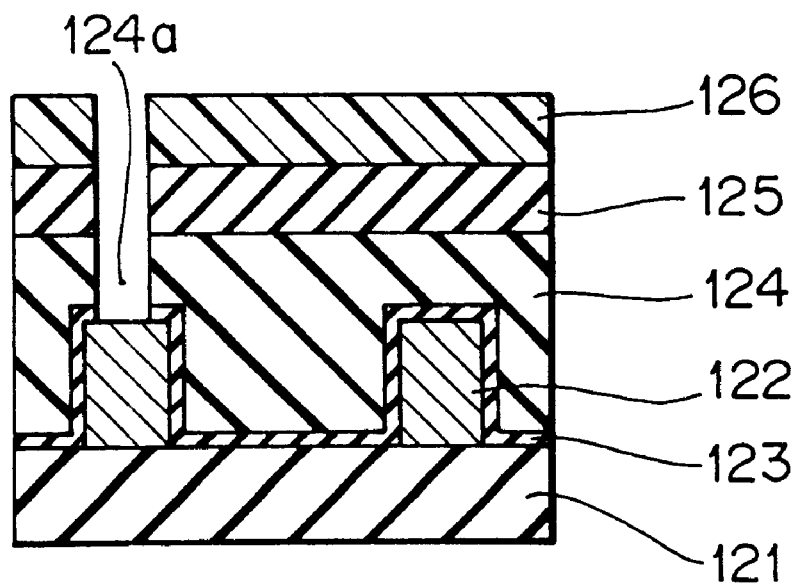
Figure 3C:
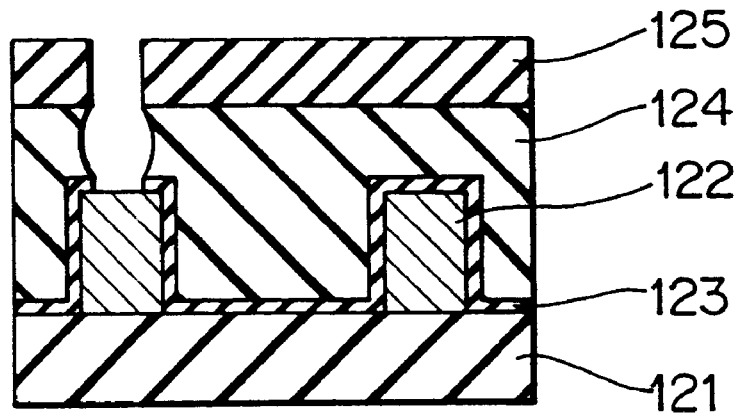
Figure 3D:
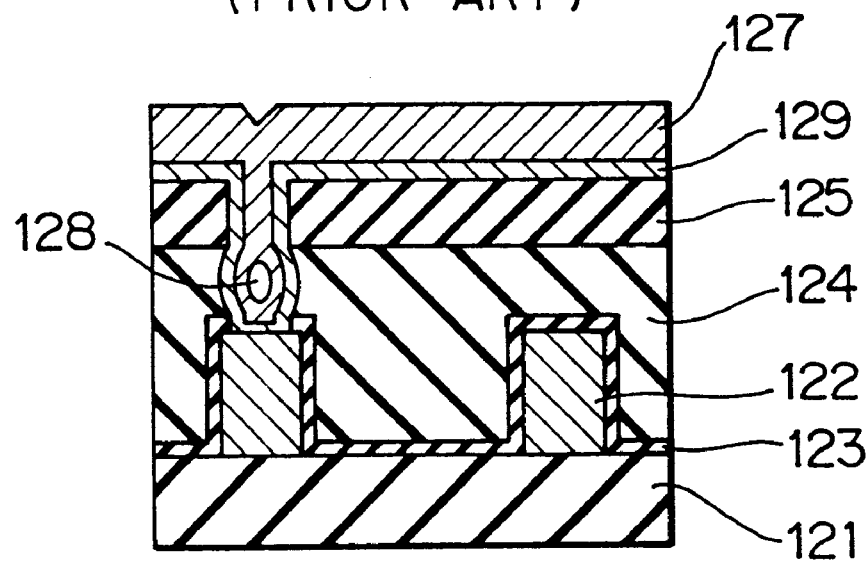
Figure 4A:
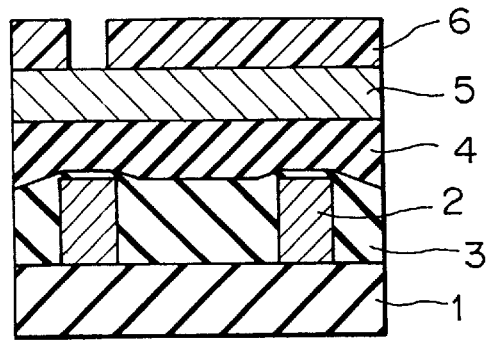
FIGS. 4A to 4F are sectional views showing a method of manufacturing a semiconductor device in sequential order according to a first embodiment of the present invention.

In this embodiment, as shown in FIG. 4A, a first silicon oxide film 1 with a thickness of, for example, about 500 nm is formed on a silicon substrate (not shown). A first aluminum-based metal wiring layer 2 is selectively formed on the first silicon oxide film 1. An HSQ film 3 having a thickness of, for example, about 400 nm is formed on the first silicon oxide film 1 by application and annealing as a film whose dielectric constant is lower than that of a silicon oxide film. At this time, the upper surface of the first aluminum-based metal wiring layer 2 is coated with the HSQ film 3. A second silicon oxide film 4 with a thickness of, for example, about 1,400 nm is then formed on the HSQ film 3. Then, for formation of a flat surface, the thickness of the second silicon oxide film 4 is reduced to as thin as, for example, about 700 nm by CMP (chemically mechanical polishing). A tungsten silicide film 5 with a thickness of, for example, about 100 nm is then formed on the second silicon oxide film 4 by sputtering. After that, a photoresist 6 is applied to the tungsten silicide film 5. The applied photoresist 6 is exposed and developed so that it has a prescribed pattern.

Figure 4B:
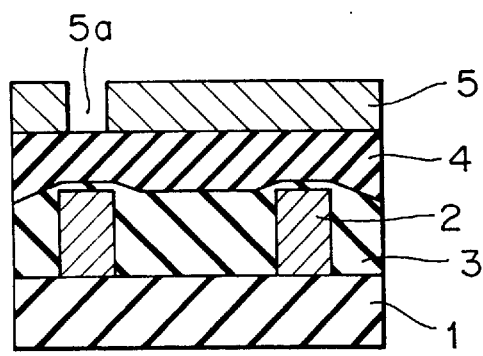

Next, the tungsten silicide film 5 is etched by a chlorine-containing gas using the photoresist 6 as a mask as shown in FIG. 4B. This allows an opening 5a of the tungsten silicide film 5 to be formed under an opening of the photoresist 6. Then, an $O_2$ plasma process is performed and the photoresist 6 is exposed to a resist releasing solution whereby it is removed.

Figure 4C:
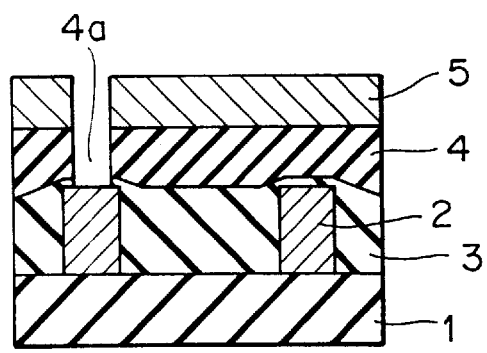

After that, the second silicon oxide film 4 and the HSQ film 3 are etched using fluorocarbon gas and using the tungsten silicide film 5 as a mask. In this case, volatile $WF_6$ gas or $SiF_4$ gas is produced, so the deposition of the tungsten silicide film 5 is restricted. As a consequence, as shown in FIG. 4C, a contact hole 4a extending to the first aluminum-based metal wiring layer 2 is formed under the opening 5a of the tungsten silicide film 5.

Figure 4D:
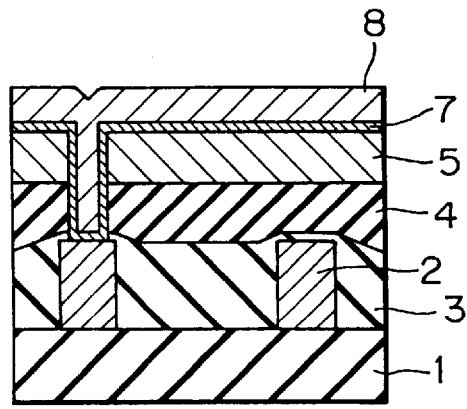

Then, as shown in FIG. 4D, a titanium nitride film 7 with a thickness of, for example, about 50 nm is formed on the entire surface as a barrier metal film while the tungsten silicide film 5 is retained. A tungsten film 8 with a thickness of, for example, about 500 nm is successively formed on the titanium nitride film 7.

Figure 4E:
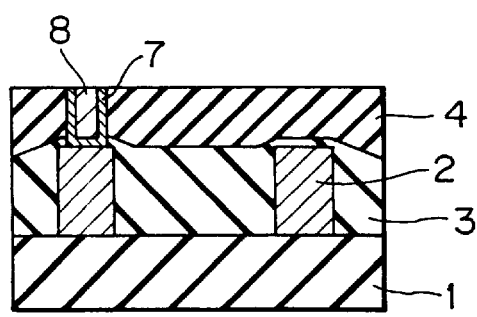

Next, as shown in FIG. 4E, the tungsten film 8, the titanium nitride film 7, and the tungsten silicide film 5 which are formed on the second silicon oxide film 4 are removed by metal CMP. Therefore, the tungsten film 8 and the titanium nitride film 7 formed only within the contact hole 4a are left unremoved.

Figure 4F:
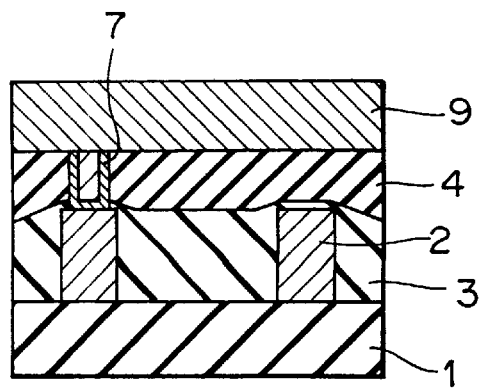

As shown in FIG. 4F, a second aluminum-based metal wiring layer 9 is formed on the entire surface. After this, the same processes as above are repeated to complete the production of a semiconductor device having multilayer wiring.

In this embodiment, the HSQ film 3 which tends to increase in water content by an $O_2$ plasma process is not exposed when the $O_2$ plasma process is carried out. Therefore, no void is produced within the contact hole 4a whereby any increase in the junction resistance is prevented and any increase in the dielectric constant of the HSQ film 3 caused by an increased water content can be avoided.

Next, a second embodiment of the present invention will be explained. FIGS. 5A to 5F are sectional views showing a method of manufacturing a semiconductor device in sequential order according to a second embodiment of the present invention.

Figure 5A:
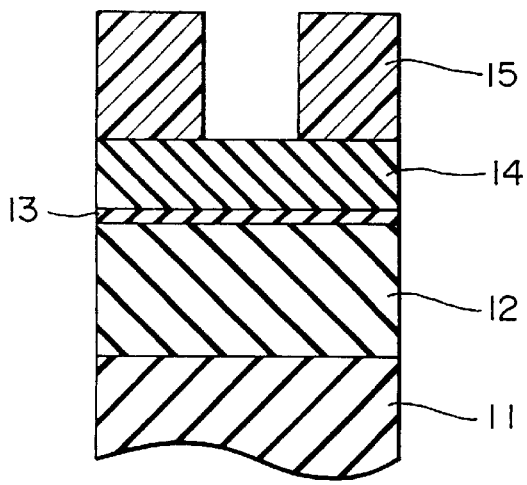
FIGS. 5A to 5F are sectional views showing a method of manufacturing a semiconductor device in sequential order according to a second embodiment of the present invention.

In this embodiment, as shown in FIG. 5A, a lower layer insulating film 11 is formed on a semiconductor substrate (not shown). An HSQ film 12 with a dielectric constant lower than that of a silicon oxide film is formed as an interlayer insulating film on the lower layer insulating film 11 by application and annealing. A silicon nitride film 13 with a thickness of, for example, about 100 nm and a silicon oxide film 14 with a thickness of, for example, about 400 nm are deposited in this order on the HSQ film 12. It is noted that the silicon nitride film has degrees of moisture absorption and deformation in an oxygen plasma process and exposure to a resist releasing solution equal to or less than those of a silicon oxide film. Then, a photoresist 15 is deposited on the silicon oxide film 14 and is subjected to photolithography in which a channel-wiring pattern is formed on the photoresist.

Figure 5B:
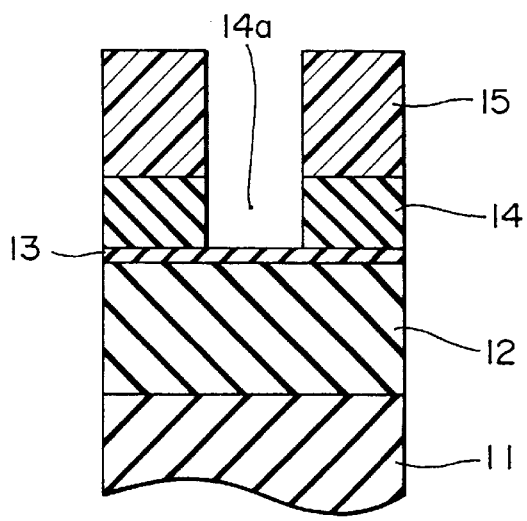

Next, as shown in FIG. 5B, the silicon oxide film 14 is etched by reactive ion etching (RIE) using $C_4F_8$ gas, CO gas and Ar gas and using the photoresist 15 as a mask. In this case, the selective ratio of the etching rates of the silicon nitride film 13 and silicon oxide film 14, that is, $SiN:SiO_2$ is designed to be 1:20, whereby the silicon nitride film 13 functions as an etching stopper. As a consequence, a wiring channel 14a with a depth of about 400 nm is formed.

Figure 5C:
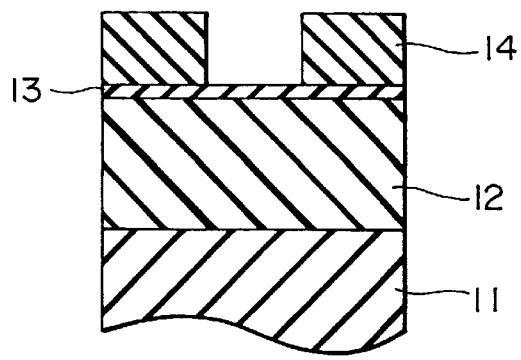

Next, an $O_2$ plasma process is performed and, as shown in FIG. 5C, the photoresist 15 is removed using an organic solvent. At this time, the HSQ film 12 is protected by the silicon nitride film 13.

Figure 5D:
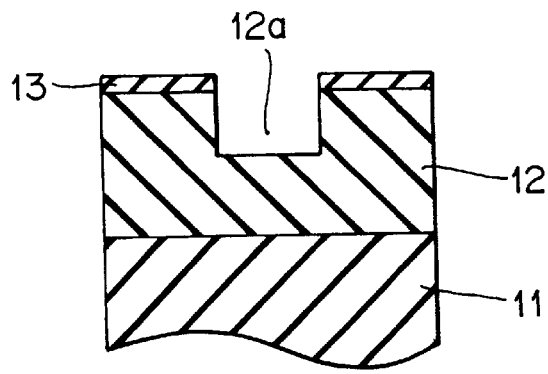

As shown in FIG. 5D, the silicon oxide film 14, the silicon nitride film 13, and the ESQ film 12 are etch-backed at the same etching rates by RIE using $CHF_3$ gas. The silicon oxide film 14 is entirely removed and at the same time a channel 12a with a depth of, for example, about 400 nm is formed in the HSQ film 12.

The etching for forming the channel 12a may be performed by the following method. First, the silicon oxide film 14 and the silicon nitride film 13 are etched at almost the same etching rates until the silicon nitride film 13 is penetrated through. Then, the silicon oxide film 14 is etched at a etching rate greater than that of the silicon nitride film 13. In this case, since the HSQ film 12 is etched at the same rate as that of the silicon oxide film 14, the HSQ film 12 is etched making use of the already patterned silicon nitride film 13 as a hard mask. When not an HSQ film but a layer insulating film having a high selective ratio against the silicon nitride film 14 is formed as a film with a low dielectric constant, the silicon nitride film 14 is formed into a film with such a thickness that the film can be thoroughly removed with the formation of a pattern on the silicon nitride film 13. Such measures make it possible to perform more accurate patterning of the silicon nitride film 13 and ESQ film 12 by RIE.

Figure 5E:
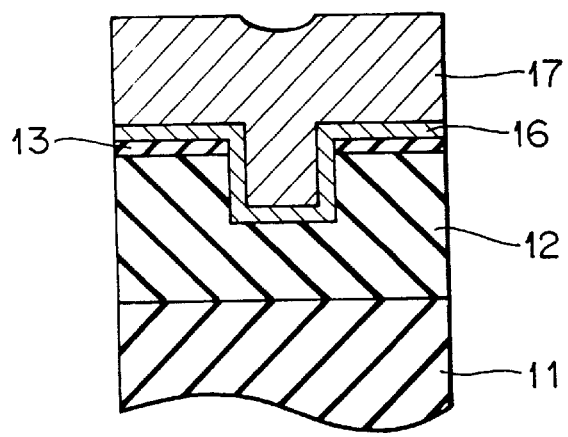

Next, as shown FIG. 5E, a titanium film 16 with a thickness of, for example, 20 nm is deposited as a barrier metal film on the entire surface by sputtering. In succession, an aluminum film 17 with a thickness of, for example, 800 nm is deposited as a wiring metal film on the titanium film 16 by sputtering.

Figure 5F:
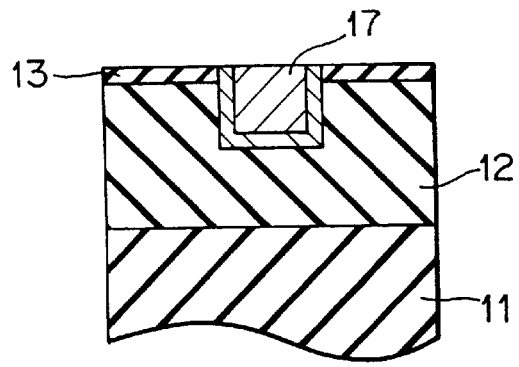

Then, as shown in FIG. 5F, the aluminum film 17 and the titanium film 16 formed on the silicon nitride film 13 are removed by chemically mechanical polishing (CMP) while leaving these films 16, 17 unremoved only within the channel 12a.

In this embodiment, since the ESQ film 12, which tends to increase in water content by the $O_2$ plasma process, is not also exposed in the O$_2$ plasma process, a rise in the dielectric constant with an increase in water content is prevented.

Incidentally, in this embodiment, the silicon nitride film 13 is used as an insulating film which has degrees of moisture absorption and deformation in an oxygen plasma process and exposure to a resist releasing solution equal to or less than those of a silicon oxide film. It is particularly preferable that the silicon nitride film be a plasma silicon nitride film. A plasma silicon oxide film or a plasma silicon oxynitride film may be used as such an insulating film.

Figure 6A:
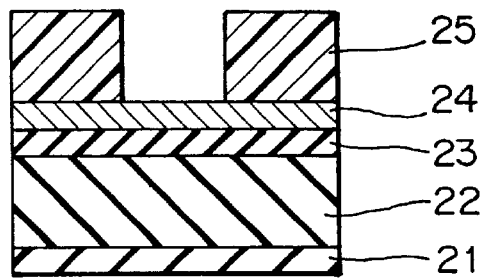
FIGS. 6A to 6E are sectional views showing a method of manufacturing a semiconductor device in sequential order according to a third embodiment of the present invention.

Next, a third embodiment of the present invention will be explained. FIGS. 6A to 6E are sectional views showing a method of manufacturing a semiconductor device in sequential order according to a third embodiment of the present invention. In this embodiment, as shown in FIG. 6A, a first silicon oxide film 21 with a thickness of, for example, 0.1 μm is formed on a semiconductor substrate (not shown). An HSQ film 22 having a thickness of, for example, 0.4 μm and a dielectric constant lower than that of a silicon oxide film is formed on the first silicon oxide film 21 by application and annealing. A second silicon oxide film 23 with a thickness of, for example, 0.05 μm is deposited on the HSQ film 22. Furthermore, a W (tungsten) film 24 with a thickness of, for example, 0.05 μm is deposited on the second silicon oxide film 23. In succession, a photoresist 25 is applied to the tungsten film 24 and is subjected to photolithography in which a channel-wiring pattern is formed on the photoresist.

Figure 6B:
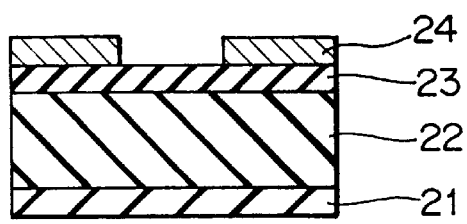

Next, as shown in FIG. 6B, the tungsten film 24 is patterned by dry etching using the photoresist 25 as a mask. After that, the photoresist 25 is released by ashing treatment of O$_2$ plasma and treatment using an organic alkali solution. At this time, the dry etching residue is also removed. In this releasing treatment, the surface of the HSQ film 22 is not damaged because it is coated with the second silicon oxide film 23.

Figure 6C:
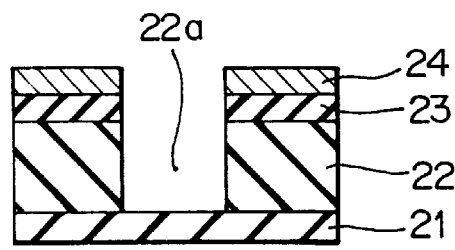

As shown in FIG. 6C, the second silicon oxide film 23 and the HSQ film 22 are etched in an oxide film dry etching condition using the tungsten film 24 as a mask until the first silicon oxide film 21 is exposed. This allows a channel 22a for a damascene method to be formed. Here, the damascene method comprises a step of forming an insulating film formed with a hole or a channel in a prescribed area and a step of installing wiring layer in the hole or the channel.

Figure 6D:
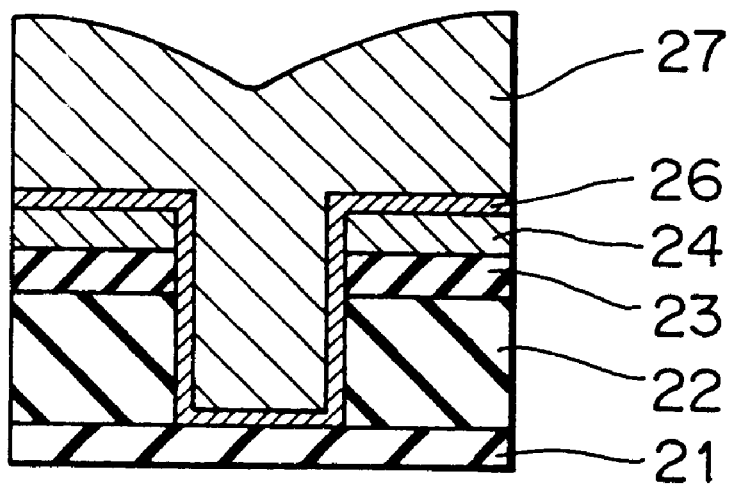

Next, as shown in FIG. 6D, a TiN film 26 with a thickness of, for example, 0.05 μm is formed on the entire surface as a barrier metal film. In succession, a copper film 27 is deposited on the TiN film 26 as a metal wiring film.

Figure 6E:
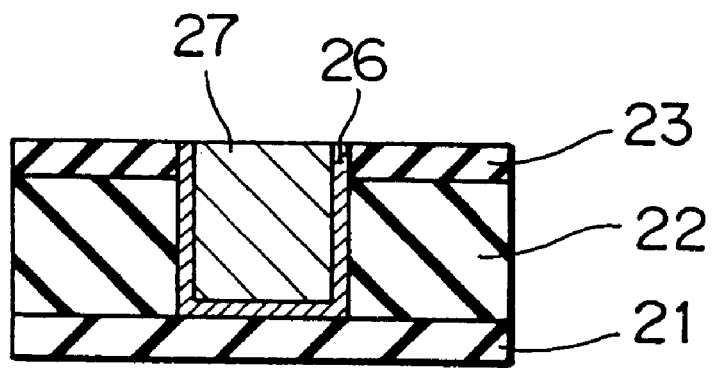

As shown in FIG. 6E, the copper film 27, TiN film 26 and tungsten film 24 on the second silicon oxide film 23 are removed by CMP whereby the copper film 27 and TiN 26 formed only within the channel 22a are left unremoved.

Also, in this embodiment, since the HSQ film 22, which tends to increase in water content by the O$_2$ plasma process, is not also exposed in the O$_2$ plasma process, a rise in the dielectric constant with an increase in water content is prevented.

Incidentally, as a method for burying the copper film 27 and TiN film 26 in this invention, a CVD method, sputtering method, and plating method utilizing a sputtering or CVD method for seeding and the like are exemplified. Among these methods, a CVD method having high coating characteristics and burial characteristics is most desirable. In the case of using a sputtering method, it is necessary to reflow at a high temperature.

Also, a silicon nitride film may be adopted as the base film instead of the first silicon oxide film 21. In this case, the etching is performed in the dry etching condition of high selectivity between a silicon oxide film and a silicon nitride film thereby terminating the etching just before it reaches the base film in a highly controlled condition.

As the second silicon oxide film 23, a plasma silicon oxide film which has reduced water content therein and which is formed using high density plasma, e.g. an ECR method, is preferred.

Furthermore, given as examples of the exposure for patterning of the photoresist 25 are exposure to light, e.g. I-line or G-line, exposure to excimer laser, e.g. KrF, ArF, exposure to EB (Electron Beam), and exposure to X-ray.

A TiN film or a titanium film may be formed instead of the tungsten film 24.

Next, a fourth embodiment of the present invention will be explained. Though the WSi film is used in the first embodiment and the tungsten film in the third embodiment as the mask for forming the contact hole or the channel in the HSQ film, a TiN film may be used as the mask. It is noted that almost no etching deposit is produced when a WSi film or a tungsten film is used, but some etching deposits tend to be produced when the TiN film is used. This embodiment has an object of avoiding such a drawback. FIGS. 7A to 7E are sectional views showing a method of manufacturing a semiconductor device in sequential order according to a fourth embodiment of the present invention.

Figure 7A:
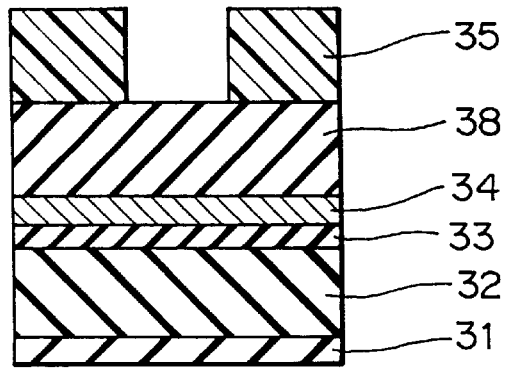
FIGS. 7A to 7E are sectional views showing a method of manufacturing a semiconductor device in sequential order according to a fourth embodiment of the present invention.

In this embodiment, as shown in FIG. 7A, a first silicon oxide film 31 is formed on a semiconductor substrate (not shown). An HSQ film 32 with a dielectric constant lower than that of a silicon oxide film is formed on the first silicon oxide film 31 by application and annealing. A second silicon oxide film 33 is deposited on the HSQ film 32. Furthermore, a TiN film 34 is deposited on the second silicon oxide film 33 and in succession a third silicon oxide film 38 with a thickness of, for example, 0.05 μm is formed on the TiN film 34. In this case, the film thickness of the third silicon oxide film 38 is preferably designed to be the sum of those of the second silicon oxide film 33 and HSQ film 32. A photoresist 35 is applied to the third silicon oxide film 38 and is subjected to photolithography in which a channel-wiring pattern is formed on the photoresist by patterning.

Figure 7B:
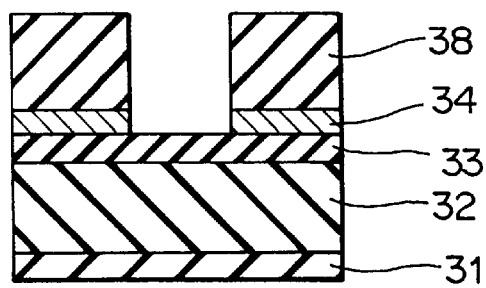

Next, as shown in FIG. 7B, the third silicon oxide film 38 is patterned using a fluorine-type etching gas and using the photoresist 35 as a mask. Furthermore, the TiN film 34 is patterned using a chlorine-type etching gas and using the photoresist 35 as a mask. After that, the photoresist 35 is released by an O$_2$ plasma process and so on. At this time, the surface of the HSQ film 32 is not damaged because it is coated with the second silicon oxide film 33.

Figure 7C:
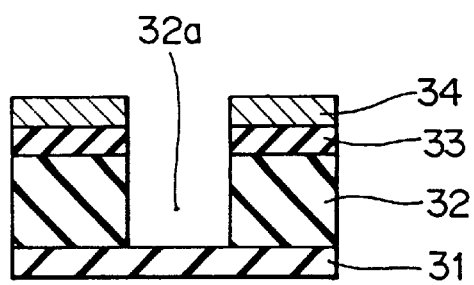

As shown in FIG. 7C, the third silicon oxide film 38 is removed by a fluorine-containing etching gas. At the same time, the second silicon oxide film 33 and the HSQ film 32 are etched to the extent the first silicon oxide film 31 is exposed. A channel 32a for a damascene method is thus formed. In this embodiment, the TiN film 34 is used as the mask when the HSQ film 32 is etched. However, no deposit is produced by the dry etching because the TiN film 34 is not directly etched.

Figure 7D:
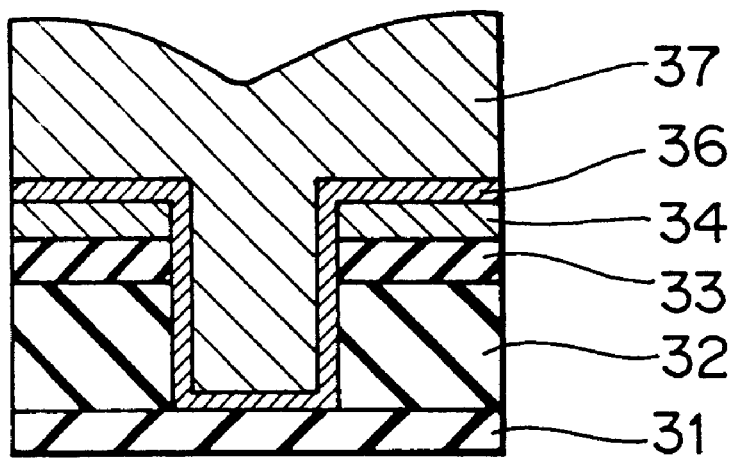

The subsequent production steps are the same as in the third embodiment. Specifically, as shown in FIG. 7D, a TiN film 36 and in succession a copper film 37 are deposited on the entire surface.

Figure 7E:
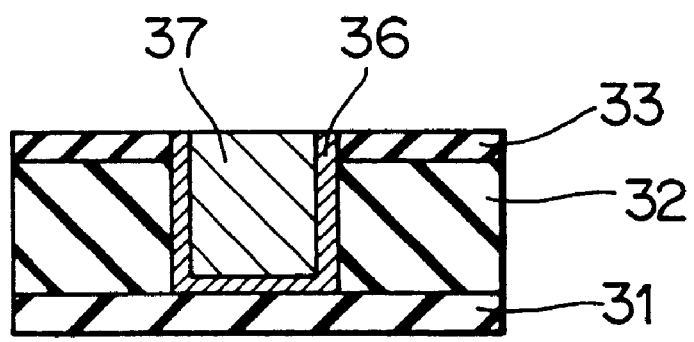

As shown in FIG. 7E, the copper film 37, TiN film 36, and TiN film 34 on the second silicon oxide film 33 are then removed by CMP whereby the copper film 37 and TiN film 36 formed only within the channel 32a are left unremoved. A damascene wiring is thus completed.

Next, a fifth embodiment of the present invention will be explained. In this embodiment, one wiring layer is formed by a single damascene method and then other one or more wiring layers are formed by a dual damascene method. FIGS. 8A to 8F are sectional views showing a method of manufacturing a semiconductor device in sequential order according to a fifth embodiment of the present invention.

Figure 8A:
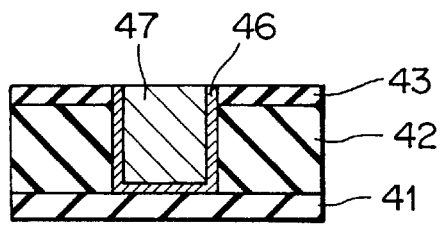
FIGS. 8A to 8F are sectional views showing a method of manufacturing a semiconductor device in sequential order according to a fifth embodiment of the present invention.

In this embodiment, as shown in FIG. 8A, a first silicon oxide film 41, an HSQ film 42, a second silicon oxide film 43, a TiN film 46, and a copper film 47 are formed on a semiconductor substrate (not shown) in the same manner as in the third embodiment.

Figure 8B:
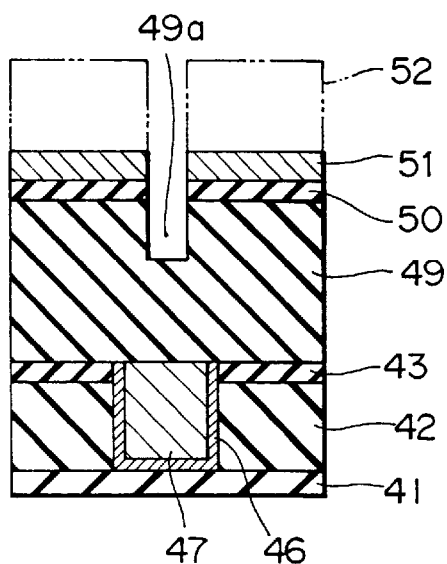

Next, as shown in FIG. 8B, an interlayer HSQ film 49 with a thickness of, for example, 1.2 $\mu$m and a dielectric constant lower than that of a silicon oxide film is formed on the entire surface by application and annealing. A third silicon oxide film 50 with a thickness of, for example, 0.05 $\mu$m and in succession a tungsten film 51 with a thickness of, for example, 0.05 $\mu$m are deposited on the interlayer ESQ film 49. A first photoresist 52 is applied to the tungsten film 51 and a pattern for a plug hole with a diameter of, for example, 0.3 $\mu$m is formed in the first photoresist 52. Next, the tungsten film 51 is patterned using the patterned first photoresist 52 as a mask. The first photoresist 52 is then released and removed by an $O_2$ plasma process and so on. The third silicon oxide film 50 and the interlayer HSQ film 49 are dry etched using the tungsten film 51 as a mask to the extent that the interlayer HSQ film 49 is etched to a depth of 0.7 $\mu$m, whereby a plug hole 49a is formed.

Figure 8C:
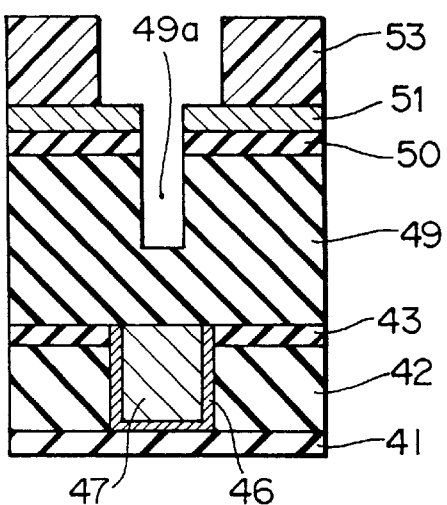

As shown in FIG. 8C, a second photoresist 53 in which a wiring pattern with a width of, for example, 0.6 $\mu$m is formed above the plug hole 49a and its vicinity is formed on the tungsten film 51.

Figure 8D:
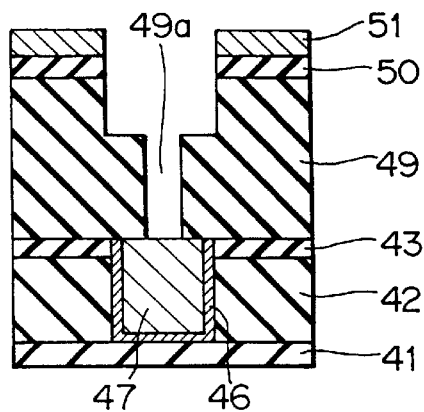

Next, as shown in FIG. 8D, the tungsten film 51 is patterned using a chlorine containing etching gas and using the second photoresist 53 as a mask. The third silicon oxide film 50 and the interlayer HSQ film 49 are subsequently dry-etched using, as a mask, the tungsten film 51 with an enlarged opening until the interlayer HSQ film 49 is etched to a depth of 0.5 $\mu$m. At this time, the plug hole 49a which has been already formed is more deepened and extends to the copper film 47. The second photoresist 53 is then removed by an $O_2$ plasma process and so on.

Figure 8E:
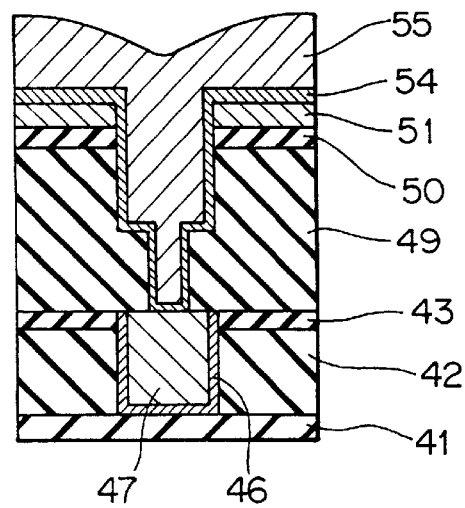

As shown FIG. 8E, a TiN film 54 is formed as a barrier metal film on the entire surface and a copper film 55 which will be a metal wiring film is formed on the TIN film 54.

Figure 8F:
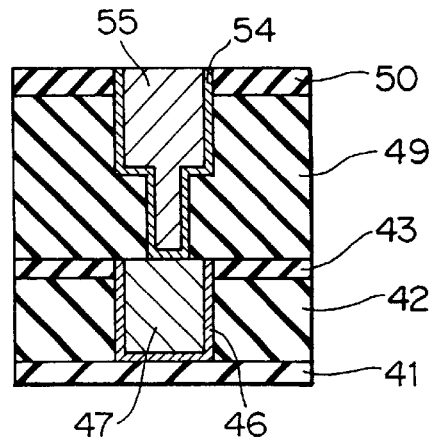

As shown in FIG. 8F, the copper film 55, the TiN film 54 and the tungsten film 51 on the third silicon oxide film 50 are removed by CMP, whereby dual damascene wiring structure is completed.

In this embodiment, though the lower wiring layer is the copper-wiring layer, it may be an aluminum-wiring layer. In such a case, easy fine processing is attained and an aluminum film can be patterned by dry etching. An application of the interlayer HSQ film after the aluminum-wiring layer as the lower layer is processed therefore brings about a flat surface. Particularly, this eliminates the CMP step.

Figure 9A:
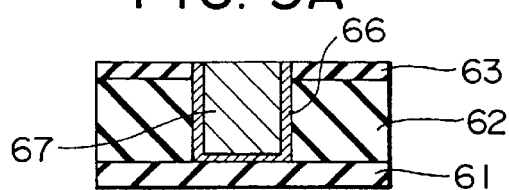
FIGS. 9A to 9I are sectional views showing a method of manufacturing a semiconductor device in sequential order according to a sixth embodiment of the present invention.

Next, a sixth embodiment of the present invention will be explained. FIGS. 9A to 9I are sectional views showing a method of manufacturing a semiconductor device in sequential order according to a sixth embodiment of the present invention. In this embodiment, as shown in FIG. 9A, a first silicon oxide film 61, an HSQ film 62, a second silicon oxide film 63, a TiN film 66 and a copper film 67 are formed on a semiconductor substrate (not shown) in the same manner as in the third embodiment.

Figure 9B:
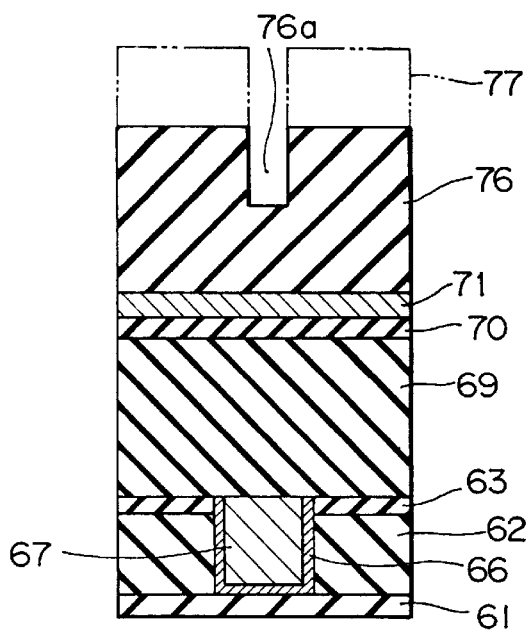

Next, as shown in FIG. 9B, an HSQ film with a dielectric constant lower than that of a silicon oxide film is applied and annealed and these steps are repeated several times, whereby an interlayer HSQ film 69 with a thickness of, for example, 1.2 $\mu$m is formed on the entire surface. A third silicon oxide film 70 with a thickness of, for example, 0.05 $\mu$m is then deposited on the interlayer HSQ film 69. A TiN film 71 with a thickness of, for example, 0.05 $\mu$m is further deposited on the third silicon oxide film 70. In succession, a fourth silicon oxide film 76 with a thickness of, for example, 0.05 $\mu$m is deposited on the TiN film 71. In this case, the film thickness of the fourth silicon oxide film 76 is preferably designed to be the sum of those of the third silicon oxide film 70 and the interlayer ESQ film 69. After that, a first photoresist 77 is applied to the surface of the fourth silicon oxide film 76 and a pattern for a plug hole with a diameter of, for example, 0.3 $\mu$m is formed in the first photoresist 77. Then, the fourth silicon oxide film 76 is patterned using the patterned first photoresist 77 as a mask to the extent that the fourth silicon oxide film 76 is etched to a depth of 0.7 $\mu$m. A pore 76a is thus formed. The first photoresist 77 is then released and removed by an $O_2$ plasma process and so on.

Figure 9C:
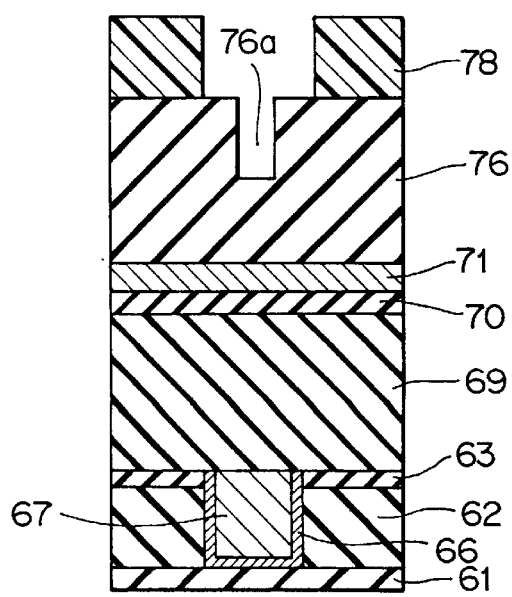

As shown in FIG. 9C, a second photoresist 78 in which a wiring pattern with a width of, for example, 0.6 $\mu$m is formed above the pore 76a and its vicinity is formed on the fourth silicon oxide film 76.

Figure 9D:
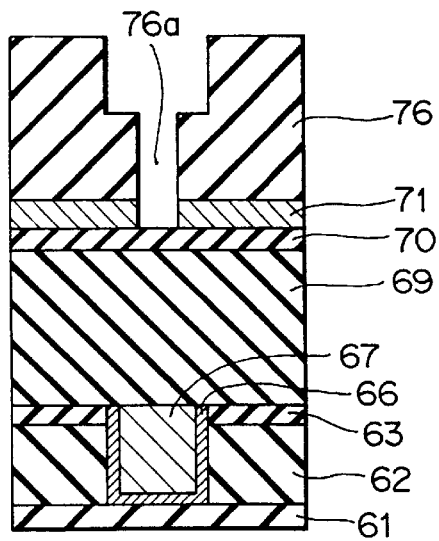

Next, as shown in FIG. 9D, the fourth silicon oxide film 76 is patterned using a fluorine containing etching gas and using the second photoresist 78 as a mask. At this time, the pore 76a which has been already formed is deepened and extends to the TiN film 71. Further, the TiN film 71 is dry-etched using a chlorine containing gas and using, as a mask, the fourth silicon oxide film 76 with an enlarged opening. The second photoresist 78 is then removed by an $O_2$ plasma process and so on.

Figure 9E:
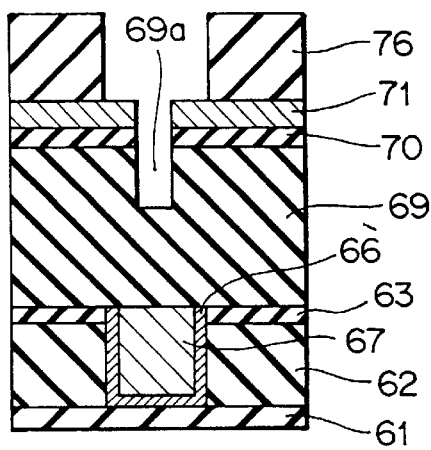

As shown FIG. 9E, the third silicon oxide film 70 and the interlayer HSQ film 69 are subsequently dry-etched using a fluorine-containing gas and using, as a mask, the patterned TiN film 71 until the interlayer HSQ film 69 is etched to a depth of 0.7 $\mu$m. Thus a plug hole 69a is formed.

Figure 9F:
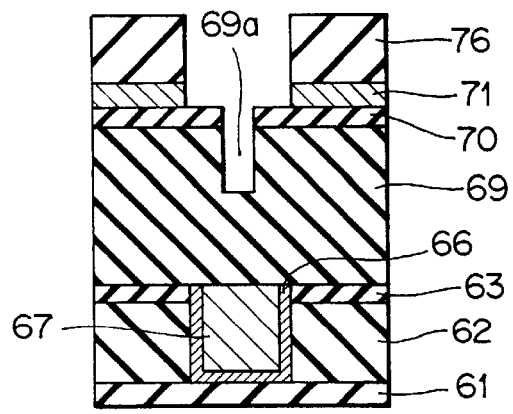

As shown in FIG. 9F, the TiN film 71 is patterned by etching using a chlorine containing gas and using the fourth silicon oxide film 76 as a mask.

Figure 9G:
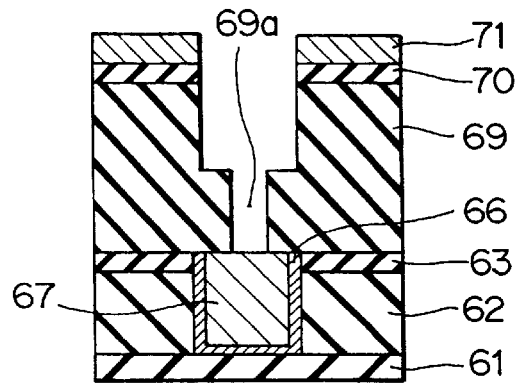

Then, as shown in FIG. 9G, the third silicon oxide film 70 and the interlayer ESQ film 69 are etched using a fluorine containing gas until the layer HSQ film 69 is etched to a depth of 0.5 $\mu$m. At this time, the fourth silicon oxide film 76 is removed and, at the same time, a channel with a reverse convex shape which extends to the copper film 67 is transferred to the interlayer HSQ film 69, whereby the plug hole 69a is deepened.

Figure 9H:
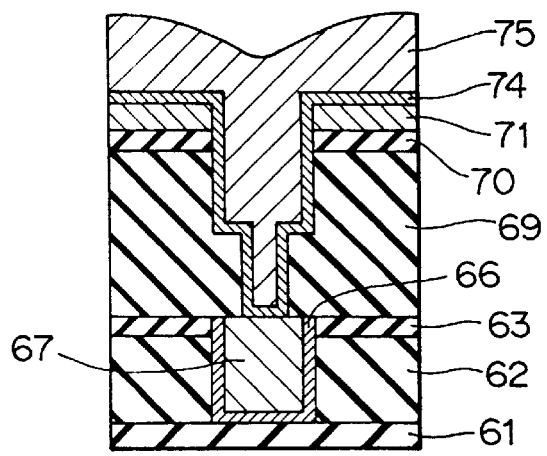

Next, as shown in FIG. 9H, a TiN film 74 is formed as a barrier metal film on the entire surface and a copper film 75 which will be a metal wiring film is formed on the TiN film 74.

Figure 9I:
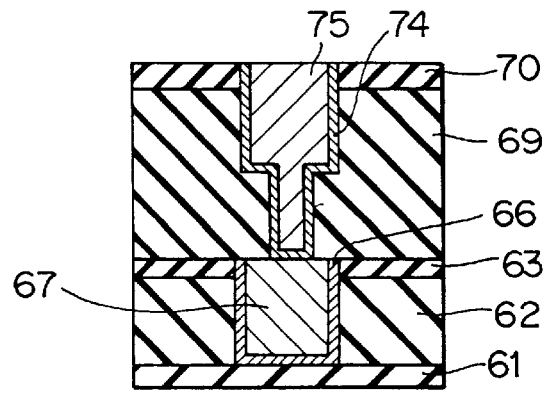

As FIG. 9I shows, the copper film 75, the TiN film 74 and the TiN film 71 formed on the third silicon oxide film 70 are removed by CMP. A dual damascene wiring structure is completed.

The foregoing embodiments all use an HSQ film as a film with a dielectric constant lower than that of a silicon oxide film. Besides the above film, a porous film with a terminal bond group of Si—H or Si—$CH_3$, an organic film such as an organic SOG film, a fluororesin film, an amorphous carbon fluoride film and a polyimide film, and the like may be used.

A metal film for masking may be formed directly on a film with a low dielectric constant.

There are no limitations to metal materials for wiring layers or to burying metal materials and any effect of the present invention does not depend on these materials. When a copper film is used, a TiN film is deposited as a base layer for the copper film, the copper film is filmed by sputtering, CVD, or plating, and then the copper film and TiN film disposed in a prescribed area are removed.

In the case where an aluminum-type film such as an aluminum film, an Al—Cu alloy film or an Al—Si—Cu alloy film is used, a titanium film is desirably used as a barrier film.

Furthermore, examples of the metal film used as a mask include a WSi film, a tungsten film, a titanium film, a TiN film and an aluminum film and the like.

A method for removing these metals is not limited to CMP, but an etchback method may be used.

What is claimed is:

1. A method of manufacturing a semiconductor device having multilayer wiring comprising the steps in sequence of:

forming a first insulating film having a dielectric constant lower than a silicon oxide film on a semiconductor substrate;

forming a second insulating film on said first insulating film wherein said second insulating film comprising of silicon nitride, silicon oxynitride or silicon oxide;

forming a metal film on said second insulating film;

patterning said metal film to be a prescribed form;

forming an opening in said second insulating film and said first insulating film using said metal film as a mask;

burying a conductive film in said opening; and removing said metal film while leaving said conductive film in said opening.

2. A method of manufacturing a semiconductor device having multilayer wiring according to claim 1, wherein said metal film is removed by chemically mechanical polishing.

3. A method of manufacturing a semiconductor device having multilayer wiring according to claim 1, wherein said first insulating film is formed of insulating material selected from the group consisting of Hydrogen Silsesquioxane, organic spin-on glass, fluororesin, amorphous carbon fluoride, and polyimide.

4. A method of manufacturing a semiconductor device having multilayer wiring according to claim 1, wherein said first insulating film is formed of a porous film having a terminal bond group of Si—H or Si—$CH_3$.

5. A method of manufacturing a semiconductor device having multilayer wiring according to claim 1, wherein said metal film is formed of a metal selected from the group consisting of tungsten silicide, tungsten, titanium, titanium nitride, and aluminum.

6. A method of manufacturing a semiconductor device having multilayer wiring according to claim 1, wherein said second insulating film comprises a silicon oxide film; and, further including the step of patterning said silicon oxide film using said metal film as a mask between said step of patterning said metal film and said step of forming said opening in said insulating film.

7. A method of manufacturing a semiconductor device having multilayer wiring according to claim 2, wherein said step of burying said conductive film comprises the steps of:

forming a barrier metal film on the side wall and the bottom of said opening; and forming a metal wiring film on said barrier metal film.

8. A method of manufacturing a semiconductor device having multilayer wiring according to claim 7, wherein said barrier metal film is a TiN film.

9. A method of manufacturing a semiconductor device having multilayer wiring according to claim 7, wherein said metal wiring film is formed of a metal selected from the group consisting of copper, aluminum, and aluminum alloy.

10. A method of manufacturing a semiconductor device having multilayer wiring according to claim 1, wherein said buried conductive film is formed after the step of forming said opening by:

forming a conductive film on entire surface; and removing said metal film and a portion of said conductive film selectively to leave said conductive film only within said opening.

* * * * *